United States Patent [19]
Van Rooyen et al.

[11] Patent Number: 6,061,005
[45] Date of Patent: May 9, 2000

[54] ENCODING OF DATA

[75] Inventors: Hendrik Jacobus Van Rooyen, Gauteng; Wilfried Erhard Otto Ilgmann, Sunnyside, both of South Africa

[73] Assignee: Microcorp Technologies (Proprietary) Limited, Gauteng, South Africa

[21] Appl. No.: 08/978,438

[22] Filed: Nov. 25, 1997

[30] Foreign Application Priority Data

Nov. 25, 1996 [ZA] South Africa ............................. 96-9882

[51] Int. Cl.$^7$ ....................................................... H03M 5/08
[52] U.S. Cl. .............................................. 341/53; 375/239
[58] Field of Search ................................... 341/53, 68, 69, 341/64; 370/212, 213, 205; 375/238, 237, 239

[56] References Cited

U.S. PATENT DOCUMENTS

| | | | |
|---|---|---|---|
| 4,085,288 | 4/1978 | Viswanathan | 178/69 |
| 4,367,497 | 1/1983 | Jenkins | 360/48 |
| 5,450,363 | 9/1995 | Christopherson et al. | 365/205 |
| 5,708,598 | 1/1998 | Saito | 365/149 |

OTHER PUBLICATIONS

ISO Standard 3554 Jan. 1976(E) p. 5.

*Primary Examiner*—Howard L. Williams
*Assistant Examiner*—Peguy JeanPierre
*Attorney, Agent, or Firm*—Killworth, Gottman, Hagan & Schaeff, L.L.P.

[57] ABSTRACT

The invention provides a method of encoding data, which includes defining a cell with a predetermined width and defining a plurality of internal signal positions within the cell, wherein the number of internal signal positions relates to the order of a symbology utilised. The invention also relates to an encoding means for encoding data, a method of decoding data, a decoding means for decoding data and a carrier with data encoded thereon.

45 Claims, 5 Drawing Sheets

ENCODING OF DATA

BACKGROUND OF THE INVENTION

This invention relates to the encoding of data. More particularly, it relates to a method of encoding data, an encoding means for encoding data, a method of decoding data, a decoding means for decoding data and a carrier with data encoded thereon.

The invention has particular application to cards with a magnetic strip thereon. Such cards have been encoded in a binary manner in a standardised way, in accordance with ISO standard 3554. In this manner of encoding, a cell is defined by a transition at the beginning of the cell and at the end of the cell, with a transition defining the end of one cell and the beginning of the next. A "1" and a "0" are defined by the presence or absence of a further transition in the center of the cell.

Those skilled in the art will be aware that magnetic cards are encoded with a number of leading and trailing 0's.

In essence, the invention implements a higher order of symbology than binary, to provide a trinary, quaternary, or higher order symbology. This is effected by using more than one internal transition position in each cell.

SUMMARY OF THE INVENTION

The invention provides a method of encoding data, in which a plurality of internal signal positions are defined within a cell having a predetermined width, with the number of internal signal positions relating to the order of a symbology utilised. As there are a plurality of internal signal positions the symbology will be higher than binary.

At least one of the internal transition positions may be non-central and one of the internal signal positions may be central.

It will be appreciated that the number of internal transition positions in a cell will define the symbology utilised and the position of a character signal or the absence of a character signal at an internal transition position will then define the character that is encoded. There will either be no character signals or only one character signal per cell.

The beginning and end of each cell may be defined by generating a start signal and an end signal, each comprising a transition between two states. Thus, the beginning of a cell is defined by a transition from one state to another and the end of the cell is similarly defined by a transition from one state to the other. Thus, a transition will define the end of one cell and the beginning of the next cell. Conveniently, with a magnetic implementation, this may be done by having saturation magnetisation of opposite polarity.

Similarly, the character signals may be defined by transitions from one state to the other.

It will be appreciated by those skilled in the art that, with a trinary symbology, two internal transition positions will be defined, that are preferably non-central. Then, for example, if there is no transition, then a 0 will be encoded, if there is an internal transition at one internal transition position then a 1 will be encoded and if there is an internal transition at the other position then a 2 will be encoded. Naturally, the three possibilities could be encoded differently, with the absence of an internal transition, and the specific positions of the internal transitions being representative of 0, 1 and 2 as desired.

With a quaternary symbology, three internal transition positions will be defined, with one of them being centrally located in the cell. The absence of a transition, the presence of an internal transition at one position, the presence of an internal transition at a second position and the presence of an internal transition at a third position are then representative of a 0, 1, 2 or 3, as desired.

It will be appreciated further that the absence of an internal transition need not define a character. Thus three internal transition positions could define a trinary symbology, rather than a quaternary symbology. Each symbology therefore includes a set of characters, the number of which depends on whether the absence of an internal transition defines a character, or not.

If a quaternary or higher even order symbology (utilising the absence of an internal transition to define a character) is used, there will be a central transition position. Thus, these symbologies are compatible with present encoding practices and could be used with existing equipment with the facility of encoding more data in addition to that basically required. Any other configuration in which the absence of an internal transition represents a character and having at least a central internal transition position representing a character, and other non-central internal transition positions, would also be compatible with present encoding practices.

Electrical signals may be generated and they may be supplied to write devices to create the transitions on a suitable medium, which as indicated above, may be magnetic.

An initial string of cells, all of the predetermined width, and all without any transitions may be generated, which define the width of the cells.

The level of symbology may be defined in designated cells, encoded in accordance with ISO 3554.

In addition, a start signal may be written on a carrier to define the beginning of a cell, a character signal may be written on the carrier at a predetermined one of a plurality of internal signal positions in accordance with a character in a symbology having a greater order than binary, and an end signal may be written on the carrier, a predetermined distance from the start, to define the end of the cell.

A series of successive cells may be generated by writing a number of strings of start, character and end signals. Each end signal, except for the last, may also be the start signal for the next cell.

The identity of an encoding device may also be recorded.

The invention further provides a method of decoding data by determining the width of a cell; and discriminating between a plurality of internal signal positions within the cell of which at least one internal signal position being non-central.

The invention further provides an encoding means for encoding data, having a cell width defining means for defining a cell with a predetermined width; and an internal signal position defining means for defining a plurality of internal signal positions within the cell, wherein the number of internal signal positions relates to the order of a symbology utilised, with at least one internal signal position being non-central.

As discussed above, the number of internal transition positions in a cell will define the symbology utilised and the presence or absence of character signals and their positions will then define the character that is encoded.

The encoding means may have a transport mechanism for moving a carrier having the medium, relative to the write device. The transport mechanism may be controlled in a closed loop fashion, with sensors being provided to sense the position of the carrier.

As is usual in the art, the encoding means may also have a read device to read what has been recorded on the carrier by the write device.

The encoding means may, in particular, include a microprocessor. The microprocessor may also receive signals from the read device to check that the correct signals have been recorded.

Interface electronic circuitry may be provided between the write device and the read device, and the microprocessor. The circuitry may include current limiting means for measuring and limiting the current supplied to the write device. It may also include an amplifier and a peak detector for conditioning signals supplied by the read device and for detecting transitions.

The microprocessor may have built in timers for accurately measuring timing pulses supplied from the peak detector and for supplying timing pulses required to accurately write the transitions on the medium.

The invention further provides a decoding means having
a cell width determining means for determining the width of a cell; and
a discriminating means for discriminating between a plurality of internal signal positions within the cell of which at least one internal signal position is non-central.

The discriminating means may discriminate between a central and a plurality of non-central internal signal positions.

The invention extends further to a carrier which has data encoded thereon in accordance with the method of the invention.

DETAILED DESCRIPTION OF THE DRAWINGS

Figure 1:
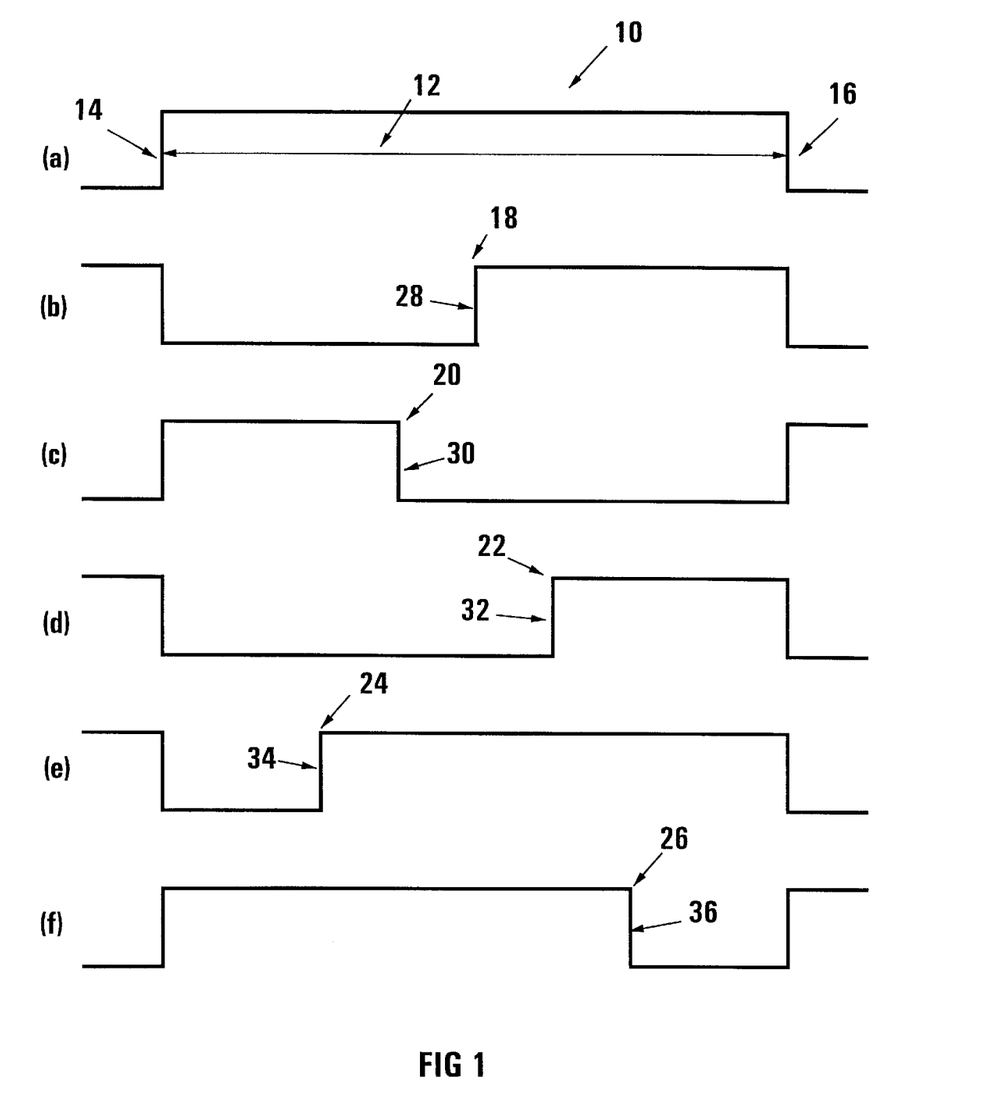
FIGS. 1(a) to (f) illustrate a method of encoding in accordance with the invention.

Referring to FIG. 1, a method of encoding a magnetic strip on a card is shown. The method uses a cell 10, shown in FIG. 1(a), which has a width 12 which is substantially constant. The width of the cell 10 is defined by a start signal or transition 14 at the beginning of the cell 10 and an end signal or transition 16 at the end of the cell 10. The transition 16 at the end of the cell 10 also defines the beginning of the next cell. It will be seen that the transitions are between two states, the transition 14 being from a low state to a high state and the transition 16 being from a high state to a low state.

The method of encoding illustrated in FIG. 1 uses either a fifth or sixth order symbology, depending on whether the absence of a transition within the cell 10, (a character signal) defines a character or not. If the absence of a character signal defines a character, then the symbology is a sixth order, and if not, a fifth order.

As shown in FIGS. 1(b) to 1(f), five internal transition positions 18, 20, 22, 24 and 26 are defined within the cell 10.

As shown in FIGS. 1(a) to 1(f), the position 18 is in the middle of the cell 10, the position 20 is ⅓rd along the cell 10, the position 22 is ⅔rd along the cell 10, the position 24 is ⅙th along the cell 10 and the position 26 is ⅚th's along the cell 10. If there is a transition 28, 30, 32, 34 or 36 at any one of the positions, then a character is defined. FIGS. 1(b) and 1(f) illustrate transitions at the various positions. The allocation of a character to each position is determined at the design stage. For example, the absence of a transition may be a "0", a transition 28 at the position 18 may be a "1", a transition 30 at the position 20 may be a "2", a transition 32 at the position 22 may be a "3", a transition 34 at the position 24 may be a "4" and a transition 36 at the position 26 may be a "6".

Figure 2:
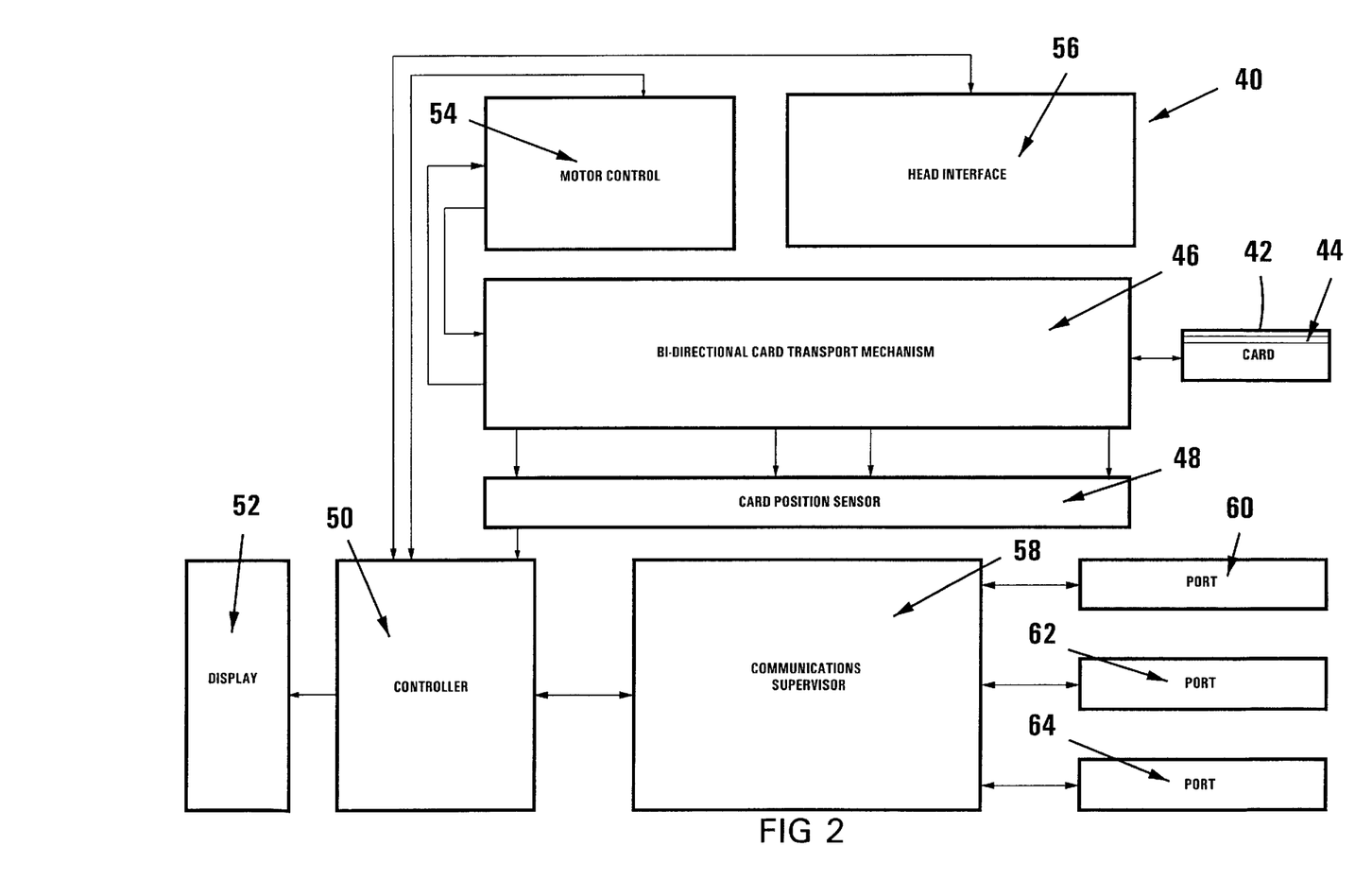
FIG. 2 is a block diagram of a motorised encoder in accordance with the invention.

Referring now to FIG. 2, a block diagram for a motorised encoder in accordance with the invention is designated generally by reference numeral 40. The encoder 40 is used to encode a card 42 with a magnetic strip 44. Such a card is referred to hereinafter as a "magcard".

The encoder 40 has a bi-directional card transport mechanism 46 which moves the magcard 42 back and forth in forward and reverse directions. The position of the magcard 42 is detected by a card position sensor 48 which supplies signals to a controller 50. The controller 50 controls the position and movement of the magcard 42 and also controls the writing and reading of data on tracks of the strip 44. A display 52 is connected to the controller 50 and indicates various aspects such as that the encoder is busy, there is an error, the magcard 42 must be removed, the magcard 42 must be inserted, and that the encoder 50 has power.

The encoder 40 further has a motor control 54 which supplies signals to the transport mechanism 46 to control the direction and speed of movement of the magcard 42. Feedback signals are supplied by the transport mechanism 46 to the motor control 54.

A head interface 56 is also supplied with signals from the controller 50. The head interface 56 addresses either tracks 1, 2 or 3 of the strip 44 and conditions data signals. The interface 56 amplifies the signals, detects peaks and converts between analogue and digital.

The encoder 40 further has a communication supervisor 58 which has a communication interface and a protocol converter. The communication supervisor 58 communicates with the controller 50 and also with a computer (not shown) via ports 60, 62 and 64.

Figure 3:
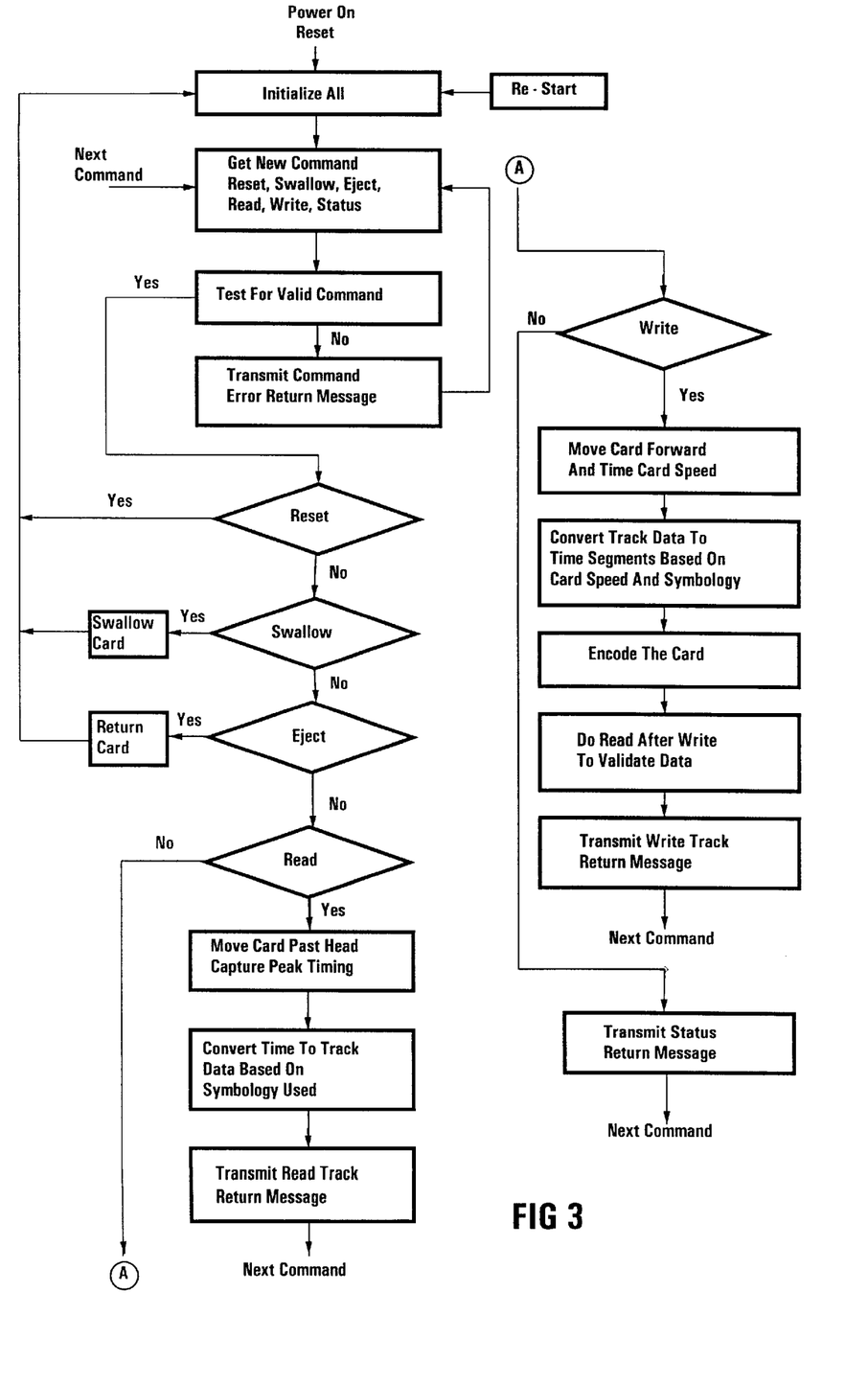
FIG. 3 is a flow chart in regard to operation of the motorised encoder.

Operation of the encoder 40 is illustrated with reference to the flow chart shown in FIG. 3. As seen in FIG. 3, when power is applied to the encoder, the device performs an initialisation routine which may include "power on" self tests. The device then waits for one of several commands, which may include:

A "reset" command;

A command to retain or swallow the card;

A command to report the status of the machine;

A command to return the card to the user by ejecting it;

A command to write data to the card; and

A command to read data from the card.

The reset command causes the machine to re start.

The swallow command causes the card in the machine to be retained in the unit for later manual removal.

The status command returns a message relating to the internal status of the machine which may include reporting the presence or absence of a card in the mechanism.

The eject command causes the card to be returned to the user by moving it to a position where the user can retrieve it.

The write command causes the machine to perform a calibrate cycle by moving the card forward and timing it to determine the speed of movement, which is needed to calculate the timings of cell widths and character positions. The data to be written as contained in the write command is then converted to the time segments required to encode the symbology in use. The card is then encoded by writing the transitions on to it in accordance with the calculations.

The next step in the write process is to validate the data written by reading it. A return message is then made up to report on the success or failure of the transaction.

Upon receipt of a read command, the device moves the card relative to the means of reading, and captures the timings generated by the peak detector and analogue to digital converter circuitry.

These timings are then analysed to discover the underlying cell timing and the positions of internal transitions within the cells in order to generate the characters of the symbology utilised.

The data thus generated is returned in the message.

Figure 4:
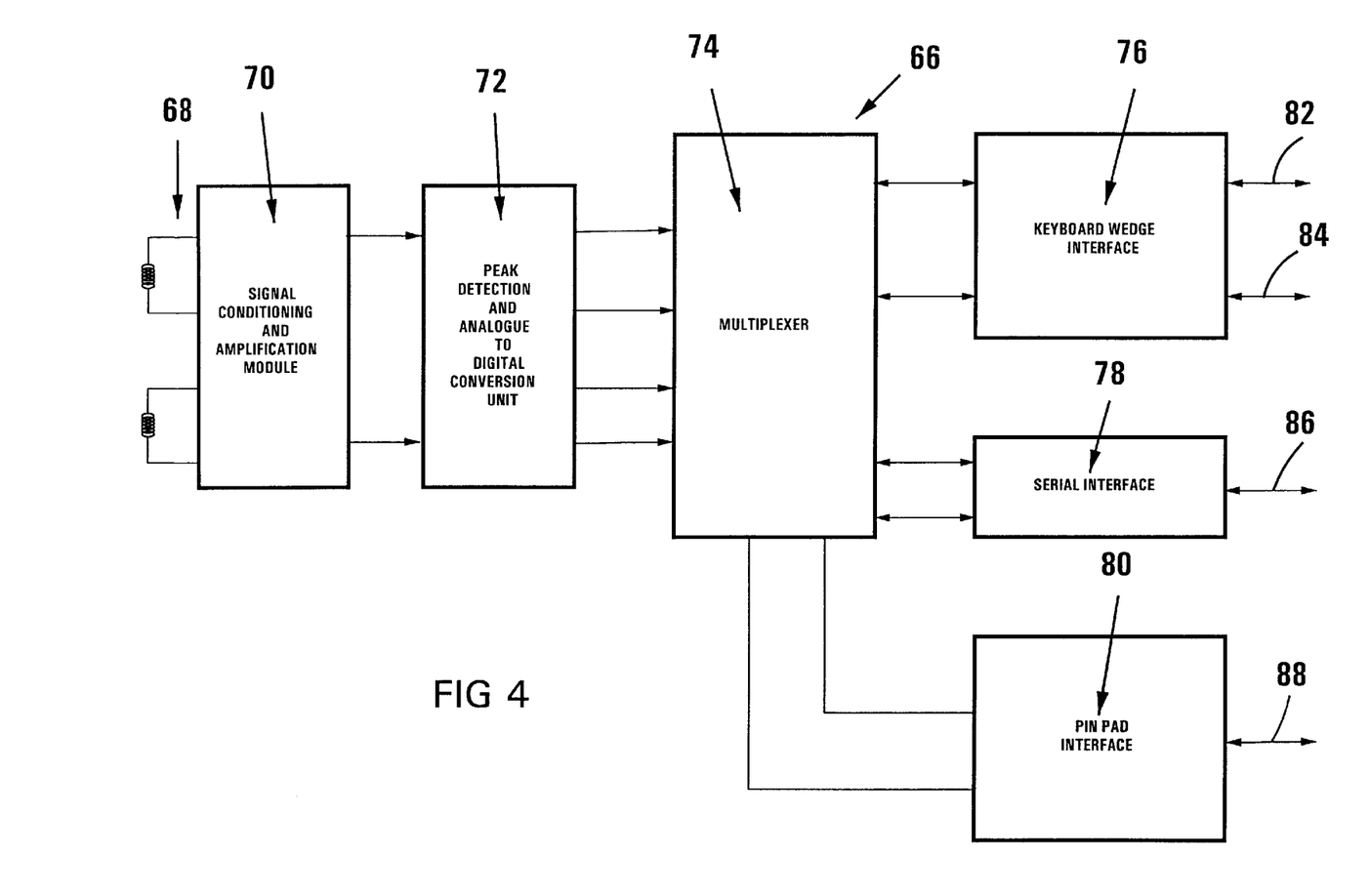
FIG. 4 is a block diagram of a swipe reader in accordance with the invention.

Referring now to FIG. 4, a swipe reader in accordance with the invention is designated generally by reference numeral 66. The reader 66 has a read head 68 which supplies signals to a signal conditioning and amplification module 70. The signal conditioning and amplification module 70 is connected to peak detection and analogue to digital conversion unit 72. The unit 72 is connected to a multiplexer 74 which communicates with a keyboard wedge interface 76, a serial interface 78 and a PIN pad interface 80. The keyboard wedge interface 76 is connected to the keyboard port of a PC (not shown) via a link 82 and with a keyboard (also not shown) via a link 84. The serial interface 78 is connected to a serial port of the PC via a link 86 and the PIN pad interface is connected to a port of a PIN pad (also not shown) via a link 88.

Figure 5:
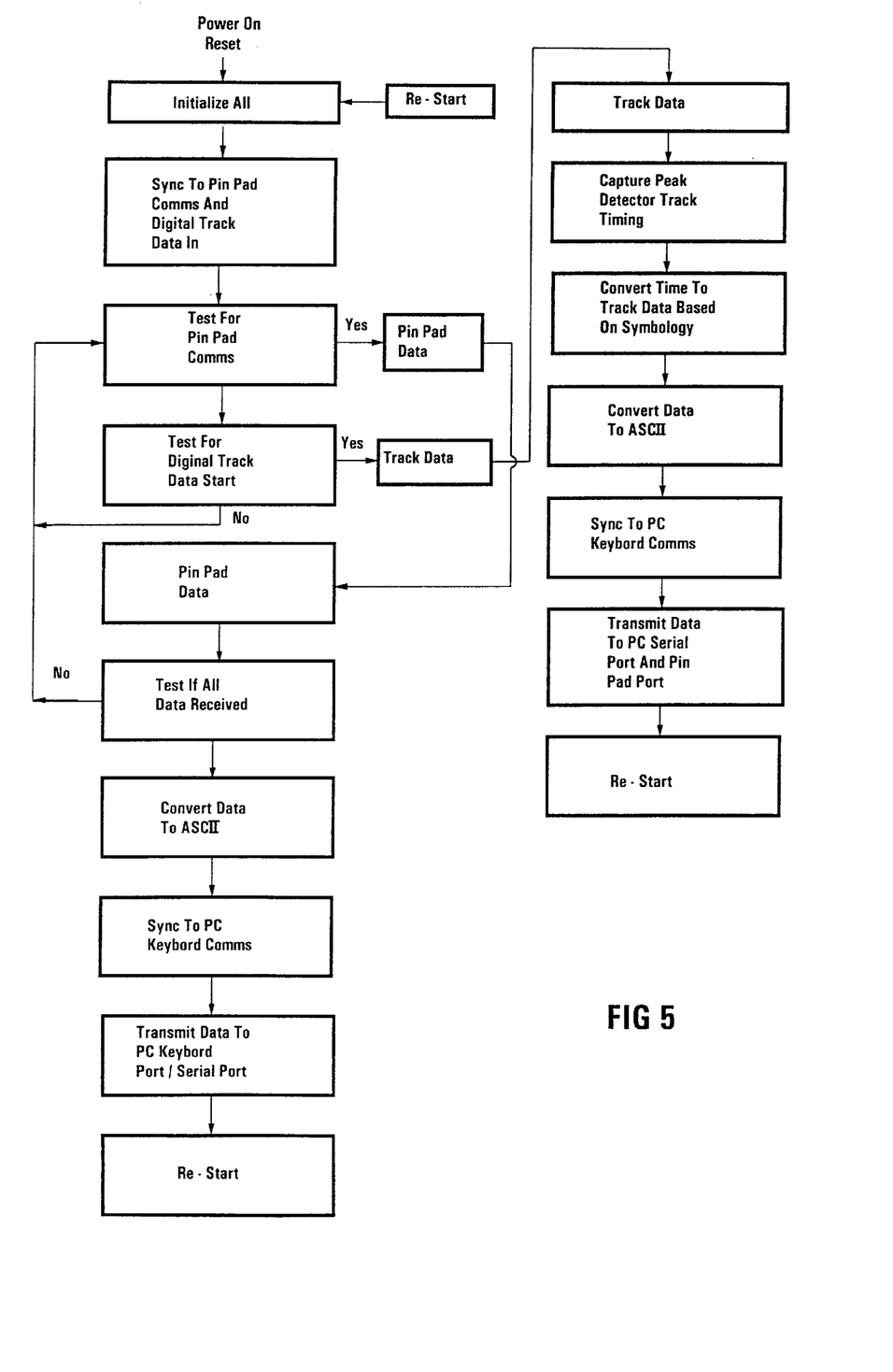
FIG. 5 is a flow chart in regard to operation of the swipe reader.

Operation of the reader is illustrated with reference to the flow chart shown in FIG. 5. As seen in FIG. 5, when power is applied to the swipe reader, it will perform initialisation routines which may include power on self tests.

It will then synchronise itself to either a card swipe or the arrival of a message from a pin pad by testing for the start of either digital data from the tracks on the card or the arrival of characters on the pin pad interface.

Upon arrival of a pin pad message, the data is converted to a format compatible with the PC keyboard interface and transmitted. It is also transmitted in ASCII along the serial interface, thereby enabling either a keyboard wedge or serial connection.

When a card is swiped, the resulting stream of transition edges from the peak detector and analogue to digital interface circuitry is timed and the timings captured.

These timing are then analysed to discover the underlying cell timing and the positions of internal transition within the cells in order to generate the character of the symbology utilised.

The data thus generated is returned in the message, which is transmitted to all three of the ports in the appropriate format for each port.

We claim:

1. A method of encoding data, utilising symbology that is of higher order than binary, which includes:

defining a cell with a predetermined width by means of a transition from one state to another at a beginning and an end of each cell;

defining a plurality of internal signal positions within the cell, the number of internal signal positions being related to the order of symbology utilised, with at least one of the internal signal positions being non-central;

specifying a set of characters, the number thereof being in accordance with the symbology order, with each position in the cell being allocated to an associated character; and providing at most one character signal at the relevant internal signal position by means of a transition from one state to the other.

2. The method as claimed in claim 1, in which one of the internal signal positions is central.

3. The method as claimed in claim 1, in which the absence of a character signal at all of the positions denotes a character.

4. The method as claimed in claim 1, in which the data is encoded on a magnetic carrier, with the two states comprising saturation magnetisation of opposite polarity.

5. The method as claimed in claim 1, in which the width of the cell is defined by generating an initial string of cells, all of the predetermined width, and without any character signals.

6. The method as claimed in claim 1, which includes writing a start signal on a carrier to define the beginning of a cell, writing a character signal on the carrier at a predetermined one of a plurality of internal signal positions in accordance with a character in a symbology having a greater order than binary, and writing an end signal on the carrier, a predetermined distance from the start signal, to define the end of the cell.

7. The method as claimed in claim 6, which includes generating a series of successive cells by writing a number of strings of start, character and end signals.

8. The method as claimed in claim 7, in which each end signal, except for the last, is also the start signal for the next cell.

9. The method as claimed in claim 1, which includes recording the identity of an encoding device.

10. A carrier which has data encoded thereon in accordance with the method as claimed in claim 1.

11. A method of decoding data, utilising symbology that is of higher order than binary, which includes:

determining the width of a cell by detecting a transition from one state to another state at positions substantially at a beginning and an end of the cell;

detecting the presence of at most one character signal within the cell, at one of a plurality of designated signal positions within the cell, by detecting a change of state within the cell at substantially the said positions; and generating a specified character in accordance with the position of the detected character signal in the cell.

12. The method as claimed in claim 11, in which one of the internal signal positions is central.

13. The method as claimed in claim 11, which includes detecting the absence of a character signal at all of the position within the cell;

determining from the absence of a character signal which character is denoted.

14. The method as claimed in claim 11, in which the data is encoded on a magnetic carrier, with the two states comprising saturation magnetisation of opposite polarity.

15. The method as claimed in claim 11, which includes determining the width of the cell by detecting an initial string of cells without any character signals.

16. The method as claimed in claim 11, which includes reading a start signal on a carrier which defines the beginning of a cell, reading a character signal on the carrier at a predetermined one of a plurality of internal signal positions in accordance with a character in the symbology, and reading an end signal on the carrier, a predetermined distance from the start signal, which defines the end of the cell.

17. The method as claimed in claim 16, which includes recognising a series of successive cells by reading a number of strings of start, character and end signals.

18. The method as claimed in claim 17, in which the step of reading includes generating electrical signals and supplying them to a processing means to interpret the signals.

19. An encoding means for encoding data, utilising symbology that is of higher order than binary, which includes;
   a cell width defining means for defining a cell with a predetermined width by means of a transition from one state to another at a beginning and an end of each cell;
   an internal signal position defining means for defining a plurality of internal signal positions within the cell, the number of internal signal positions being related to the order of symbology utilised, with at least one of the internal signal positions being non-central and with each position in the cell being allocated to an associated character in a set of characters, the number of characters being in accordance with the symbology order; and
   a character signal generating means for generating at most one character signal at the relevant internal signal position by means of a transition from one state to the other.

20. The encoding means as claimed in claim 19, in which the internal signal position defining means defines one central internal signal position.

21. The encoding means as claimed in claim 19, in which the signal generating means refrains from generating a character signal in a cell, with the absence of a signal at all the positions denoting a specific character.

22. The encoding means as claimed in claim 19, in which the data is encoded on a magnetic carrier, with the two states comprising saturation magnetisation of opposite polarity.

23. The encoding means as claimed in claim 19, which includes a write device for writing a start signal on a carrier to define the beginning of a cell, writing a character signal on the carrier at a predetermined one of a plurality of internal signal positions in accordance with a character in the symbology, and writing an end signal on the carrier, a predetermined distance from the start signal, to define the end of the cell.

24. The encoding means as claimed in claim 23, in which the write device also writes a number of signals on the carrier, the signals being a string of start, character and end signals for a series of successive cells.

25. The encoding means as claimed in claim 23, which includes an electrical signal generating means for supplying the write device with electrical signals to create the transitions on a suitable medium.

26. The encoding means as claimed in claim 23, which includes a transport mechanism for moving a carrier comprising the medium, relative to the write device, the transport mechanism being controlled in a closed loop fashion, with sensors being provided to sense the position of the carrier.

27. The encoding means as claimed in claim 26, which includes a read device to read what has been recorded on the carrier by the write device and a microprocessor which receives signals from the read device to check that the correct signals have been recorded.

28. The encoding means as claimed in claim 19, which includes an identity generating means for generating signals representative of the identity of the encoding means and for recording them on the medium.

29. A decoding means, for decoding data, utilising symbology that is of higher order than binary, which includes;
   a cell width determining means for determining the width of a cell by detecting a transition from one state to another at positions which are substantially at a beginning and an end of the cell;
   a character signal detection means for detecting the presence of at most one character signal within the cell, at one of a plurality of designated signal positions within the cell, by detecting a change of state within the cell at substantially the said positions; and
   a character generating means for generating a specified character in accordance with the position of the detected character signal in the cell.

30. The decoding means as claimed in claim 29, in which;
   the character signal detection means detects the absence of a character signal at all of the positions within the cell; and
   the character generating means generates a specified character in the absence of a character signal at all of the positions.

31. The decoding means as claimed in claim 29, in which the data is encoded on a magnetic carrier, with the two states comprising saturation magnetisation of opposite polarity.

32. The decoding means as claimed in claim 29, in which the cell width determining means determines the width of the cell by detecting an initial string of cells, all having the predetermined width, and all without any character signals.

33. The decoding means as claimed in claim 29, which includes a read device for reading a start signal on a carrier which defines the beginning of a cell, reading a character signal on the carrier at a predetermined one of a plurality of internal signal positions in accordance with a character in the symbology, and reading an end signal on the carrier, a predetermined distance from the start signal, which defines the end of the cell.

34. The decoding means as claimed in claim 33, in which the read device includes means for recognising a series of successive cells by reading a number of strings of start, character and end signals.

35. The decoding means as claimed in claim 34, in which the read device includes means for generating electrical signals and supplying them to a processing means to interpret the signals.

36. A carrier which has data encoded thereon utilising symbology that is of a higher order than binary and which symbology includes a set of characters; with the data including cells, beginnings and ends of the cells being defined by a start signal and an end signal, respectively, that are a transition from one state to another, with each cell having a predetermined width; with a plurality of internal signal positions being defined within each cell, the number of internal signal positions corresponding to the order of symbology utilised and with each position corresponding to one of the characters; and, with a character signal that is also defined by a transition from one state to another at, at most, one position in each cell.

37. The carrier as claimed in claim 36, in which one of the internal signal positions is central.

38. The carrier as claimed in claim 36, in which the absence of a character signal at all of the positions denotes a character.

39. The carrier as claimed in claim 36, in which the data is encoded on a magnetic carrier, with the two states comprising saturation magnetisation of opposite polarity.

40. The carrier as claimed in claim 36, in which the data includes an initial string of cells, all of the predetermined width, and all without any character signals for defining the width of the cell.

41. The carrier as claimed in claim 36, in which the data includes a written start signal defining the beginning of a cell, a written character signal at a predetermined one of a plurality of internal signal positions in accordance with the symbology having a greater order than binary, and a written end signal, a predetermined distance from the start signal, to define the end of the cell.

42. The carrier as claimed in claim 41, in which the data includes a number of written strings of start, character and end signals defining a series of successive cells.

43. The carrier as claimed in claim 42, in which each end signal, except for the last, is also the start signal for the next cell.

44. The carrier as claimed in claim 36, in which the data includes the identity of an encoding device.

45. The carrier as claimed in claim 36, in which the carrier is a card with a magnetic strip thereon.

* * * * *

UNITED STATES PATENT AND TRADEMARK OFFICE
CERTIFICATE OF CORRECTION

PATENT NO. : 6,061,005
DATED : May 9, 2000
INVENTOR(S) : Van Rooyen et al.

It is certified that error appears in the above-indentified patent and that said Letters Patent is hereby corrected as shown below:

Claim 13, Column No. 6, line 54, "within the cell;" should read - - within the cell; and - - .

Claim 19, Column No. 7, line 10, "binary, which includes;" should read - - binary, which includes: - - .

Claim 29, Column No. 7, line 67, "binary, which includes;" should read - - binary, which includes: - - .

Claim 30, Column No. 8, line 13, "claim 29, in which;" should read - - claim 29, in which: - - .

Claim 41, Column No. 9, line 5, "symbology having a greater order than binary, and a" should read - - symbology, and a - - .

Signed and Sealed this

Twentieth Day of March, 2001

Attest:

NICHOLAS P. GODICI

Attesting Officer      Acting Director of the United States Patent and Trademark Office